US008239795B2

(12) United States Patent
Ono (10) Patent No.: US 8,239,795 B2
(45) Date of Patent: Aug. 7, 2012

(54) TIMING ANALYZING SYSTEM FOR CLOCK DELAY

(75) Inventor: Koki Ono, Tokyo (JP)

(73) Assignee: NEC Corporation, Tokyo (JP)

( * ) Notice: Subject to any disclaimer, the term of this patent is extended or adjusted under 35 U.S.C. 154(b) by 364 days.

(21) Appl. No.: 12/565,008

(22) Filed: Sep. 23, 2009

(65) Prior Publication Data

US 2010/0083205 A1      Apr. 1, 2010

(30) Foreign Application Priority Data

Sep. 26, 2008   (JP) ................................. 2008-249190

(51) Int. Cl.
*G06F 17/50*   (2006.01)
*G06F 9/455*   (2006.01)
(52) U.S. Cl. ........................ 716/108; 716/113
(58) Field of Classification Search .................. 716/108, 716/113, 100, 103
See application file for complete search history.

(56) References Cited

U.S. PATENT DOCUMENTS

| | | | | |
|---|---|---|---|---|
| 6,810,505 | B2 * | 10/2004 | Tetelbaum et al. | 716/113 |
| 6,876,961 | B1 * | 4/2005 | Marshall et al. | 703/19 |
| 7,043,708 | B2 * | 5/2006 | Tetelbaum et al. | 716/113 |
| 2004/0010761 | A1 * | 1/2004 | Tetelbaum et al. | 716/3 |
| 2004/0250225 | A1 * | 12/2004 | Tetelbaum et al. | 716/6 |
| 2009/0013292 | A1 * | 1/2009 | Brunet | 716/6 |
| 2009/0254874 | A1 * | 10/2009 | Bose | 716/6 |
| 2010/0229137 | A1 * | 9/2010 | Liu et al. | 716/6 |

FOREIGN PATENT DOCUMENTS

| | | | |
|---|---|---|---|
| JP | 03-232267 | A | 10/1991 |
| JP | 11-232310 | A | 8/1999 |
| JP | 2003-282712 | A | 10/2003 |
| JP | 2007-078536 | A | 3/2007 |
| JP | 2008152329 | A * | 7/2008 |

OTHER PUBLICATIONS

Japanese Office Action for JP2008-249190 issued Sep. 8, 2010.
T. Ohshima et al., "A delay calculation method for red ASIC with the delay library of clock-mesh", DA Symposium 2005 Information Processing Academic Society Symposium Series, vol. 2005, No. 9, Aug. 24, 2005, pp. 181-186.

* cited by examiner

*Primary Examiner* — Stacy Whitmore (57) ABSTRACT

A timing analyzing system includes an RC extracting section configured to generate an SPEF (Standard Parasitic Exchange Format) file which contains resistance and capacitance components of wirings; a delay calculating section configured to generate an SDF (Standard Delay Format) file based on the SPEF file; and a clock mesh calculating section configured to generate a corrected circuit model by simplifying a netlist on a clock path to pass through a clock mesh structure from an input stage. A timing analysis section is configured to perform timing analysis of a semiconductor integrated circuit of an analysis target based on the corrected circuit model.

15 Claims, 13 Drawing Sheets

```
Delay: -from PLL/OUT -to L1_1/IN 1.0ns
Delay: -from PLL/OUT -to L1_2/IN 1.1ns
Delay: -from PLL/OUT -to L1_3/IN 1.3ns
Tran:  -pin L1_1/IN 0.2ns
Tran:  -pin L1_2/IN 0.2ns
Tran:  -pin L1_3/IN 0.3ns
```

```
Delay: -from E1 -to L1_1/IN  1.0ns
Delay: -from E2 -to L1_2/IN  1.1ns
Delay: -from E3 -to L1_3/IN  1.3ns
Tran:  -pin L1_1/IN  0.2ns
Tran:  -pin L1_2/IN  0.2ns
Tran:  -pin L1_3/IN  0.3ns
```

TIMING ANALYZING SYSTEM FOR CLOCK DELAY

INCORPORATION BY REFERENCE

This patent application claims a priority on convention based on Japanese Patent Application No. 2008-249190. The disclosure thereof is incorporated herein by reference.

BACKGROUND OF THE INVENTION

1. Field of the Invention

The present invention relates to a timing analyzing system that examines a delay of an LSI having a clock path including a clock mesh structure.

2. Description of Related Art

Figure 1:
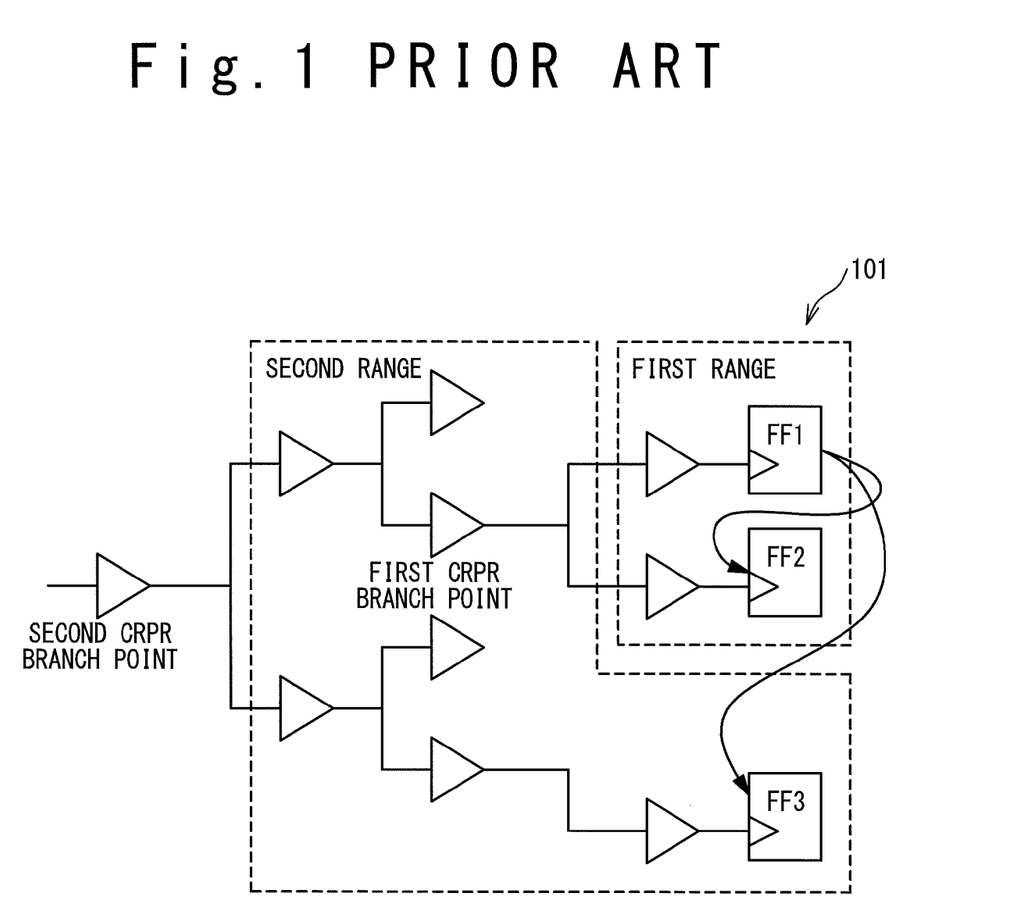
FIG. 1 is a circuit diagram illustrating a configuration of an LSI in which a clock is distributed in a clock tree system.

As a clock distribution system for an LSI, a clock tree system is known. The clock tree system is a technique for distributing a clock signal in a tree structure. FIG. 1 is a circuit diagram illustrating a configuration of an LSI in which a clock signal is distributed in the clock tree system. In the LSI of FIG. 1, a circuit is preferably designed such that a difference in arrival time (skew) of the clock signal is minimized. Japanese Patent Application Publication (JP-A-Heisei 11-232310: first conventional example) describes a technique related to an integrated circuit design supporting apparatus that uses a wiring load model, in which an arrangement extension (distance) of a logic unit is taken into consideration, and generates an optimized logic circuit. Also, Japanese Patent Application Publication (JP-P2007-078536A: second conventional example) describes a technique that simplifies a net list by integrating two or more elements into one element.

For the preferable circuit design, in the LSI of the clock tree system, a SKEW calculation in which a manufacturing variation is taken into account is performed. In general, in the LSI of the clock tree system, as an arrangement extension (distance) increases, a delay variation increases, and as the number of stages increases, the delay variation decreases. On the other hand, as the arrangement extension (distance) decreases, the delay variation decreases, and as the number of stages decreases, the delay variation increases. There is such a correlationship, and therefore, in a static timing analysis (STA) tool, a delay variation coefficient is determined from a 2-dimensional table (library) between the arrangement extension (distance) and the number of stages, and the following expression is used to model the SKEW calculation.

Setup Skew:

(transmission clock delay)−(variation coefficient (<1.0))×(reception clock delay)

Hold Skew:

(transmission clock delay)−(variation coefficient (>1.0))×(reception clock delay)

In this case, regarding the SKEW calculation obtained by taking a manufacturing variation into account, a common path to a transmission clock signal and a reception clock signal is recognized, and an arrangement extension (distance) of clock drivers subsequent to the common path is taken into account. In the clock common path, it is not necessary to consider any variation. For this reason, the arrangement extension, the number of stages, and clock delay after a common path branch point (hereinafter, to be described as a CRPR (Clock Reconvergence Pessimism Removal) branch point) are calculated.

For example, if a clock signal on a path between a first flip-flop FF1 and a second flip-flop FF2 is "uniquely" traced upstream, a path up to a first CRPR branch point can be recognized as a common path. Also, between the first flip-flop FF1 and the second flip-flop FF2, the number of stages is one, and an arrangement extension is a first range. If a clock signal on a path between the first flip-flop FF1 and a third flip-flop FF3 is "uniquely" traced upstream, a path up to a second CRPR branch point can be recognized as a common path. Also, between the first flip-flop FF1 and the third flip-flop FF3, the number of stages is three, and an arrangement extension is a second range.

Figure 2:
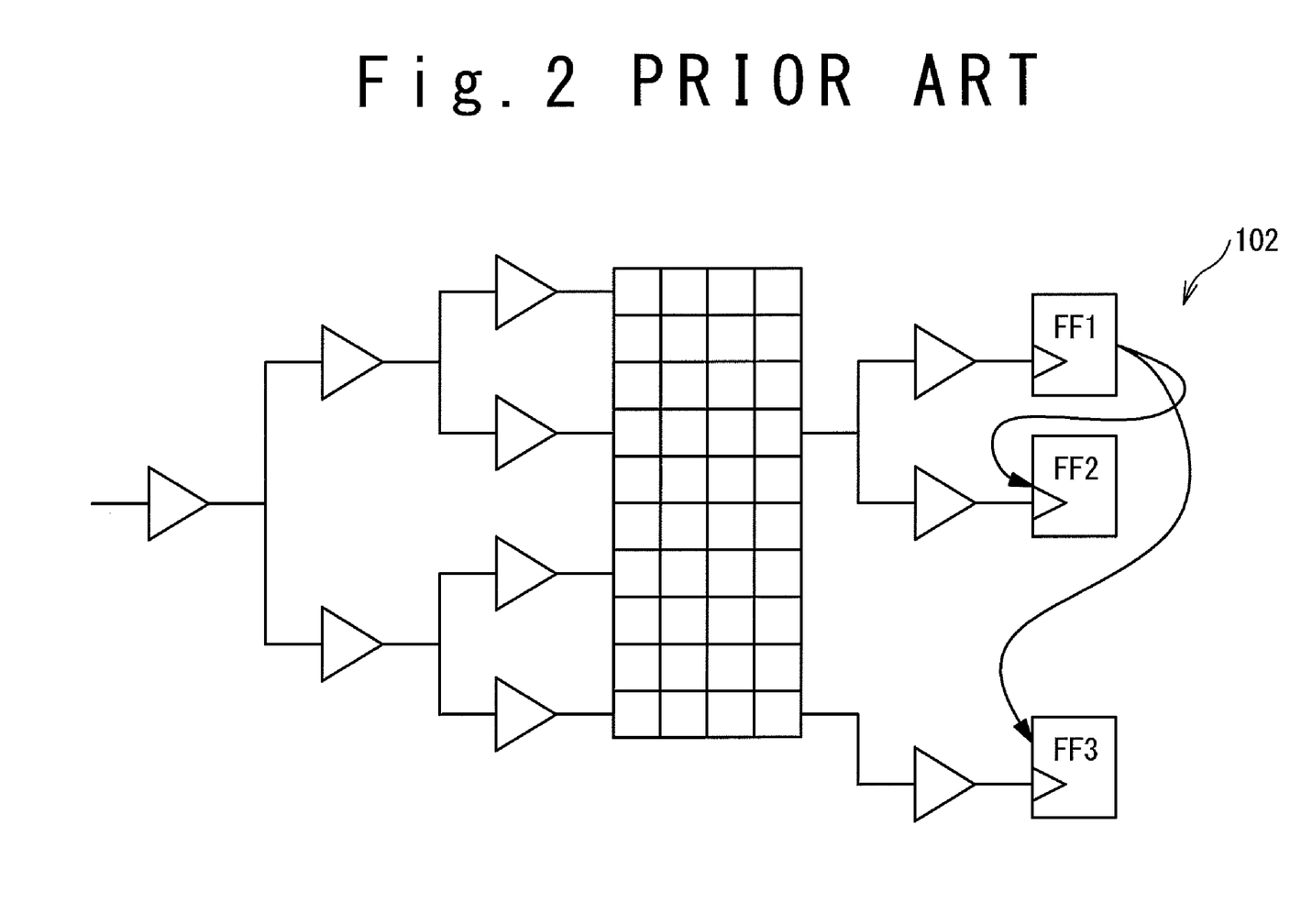
FIG. 2 is a circuit diagram illustrating a configuration of an LSI of a clock mesh system.

The clock tree system has a high degree of freedom of a layout design. However, in a large-scale circuit, there may be a case where it is difficult to reduce a difference in arrival time (skew) of a clock signal. As a clock distribution system that reduces the skew in the LSI having a large circuit scale, a clock mesh system is known in conventional techniques such as Japanese Patent Application Publications (JP-A-Heisei 03-232267: third conventional example, JP-P2003-282712A: fourth conventional example). The clock mesh system can reduce a clock delay variation due to a manufacturing variation within a chip, and reduce a skew even for a large-scale circuit. For this reason, a high-end LSI using mesh architecture as a clock structure has become widely used. FIG. 2 is a circuit diagram illustrating a configuration of an LSI of the clock mesh system. Referring to FIG. 2, in the LSI, a clock signal is distributed in a grid (mesh) structure.

As illustrated in the FIG. 1, in the typical clock tree distribution, a data line typically has a single driver configuration except for a bus, and if a fan-in (driver) side of a net or cell is traced, a unique cell is inevitably reached. On the other hand, if there is a mesh structure in a clock path, a common path cannot be recognized, and therefore an accurate arrangement extension cannot be specified. In the clock mesh structure, if a fan-in side is traced, a driver is not uniquely determined, and therefore a special algorithm or consideration on a program is required. As described, the clock mesh structure should have a multi-driver configuration, and is therefore difficult to handle with a general CAD tool.

The static timing analysis (STA) tool is also no exception. In an LSI as illustrated in FIG. 2, there is no tool that calculates a delay variation in a mesh section due to a manufacturing variation within a chip. Accordingly, it may be difficult to perform a highly accurate timing analysis with a calculation model reflecting the manufacturing variation. For example, a method is considered that uses a delay measured by a Monte Carlo SPICE simulation analysis in which a portion from a PLL to a mesh stage is extracted as a netlist of a transistor level, and manufacturing variations in a wiring medium and a transistor are used as random factors. However, this is not practice use in view of an execution time.

SUMMARY OF THE INVENTION

In an aspect of the present invention, a timing analyzing system includes an RC extracting section configured to generate an SPEF (Standard Parasitic Exchange Format) file which contains resistance and capacitance components of wirings; a delay calculating section configured to generate an SDF (Standard Delay Format) file based on the SPEF file; a clock mesh calculating section configured to generate a corrected circuit model by simplifying a netlist on a clock path to pass through a clock mesh structure from an input stage; and a timing analysis section configured to perform timing analysis of a semiconductor integrated circuit of an analysis target based on the corrected circuit model.

In another aspect of the present invention, a computer-readable recording medium is provided in which a computer-executable program code is stored to cause a computer to attain a method of performing timing analysis of a semiconductor integrated circuit. The method is achieved by generating an SPEF (Standard Parasitic Exchange Format) file which contains resistance and capacitance components of wirings; by generating an SDF file based on the SPEF file; by generating a corrected circuit model by simplifying a netlist on a clock path to pass through a clock mesh structure from an input stage; and by performing timing analysis of a semiconductor integrated circuit of an analysis target based on the corrected circuit model.

According to the present invention, a timing analysis of a clock path having a clock mesh structure is performed with higher accuracy than an existing STA system by simplifying a netlist from a PLL to a mesh net, and making a delay variation from the PLL to drivers (L1) serving as receivers of the mesh into a calculation model depending on positions of respective drivers L1.

A timing analysis is performed with a CRPR branch point being replaced by a driver L1 or a pseudo external terminal by using a corrected netlist. Also, a variation delay can be calculated in consideration of an arrangement extension that, by using a corrected SPEF, depends on a distance between the driver L1 and the flip-flop FF. Accordingly, even if a mesh is arranged on an entire surface of a chip, it is not necessary to concern the large extension.

BRIEF DESCRIPTION OF THE DRAWINGS

The above and other objects, advantages and features of the present invention will be more apparent from the following description of certain exemplary embodiments taken in conjunction with the accompanying drawings, in which.

EXEMPLARY EMBODIMENTS

Hereinafter, a timing analyzing system according to the present invention will be described with reference to the attached drawings. It should be noted that same components are assigned with same reference numerals or symbols in the drawings, and repetitive description thereof is omitted.

Figure 3:
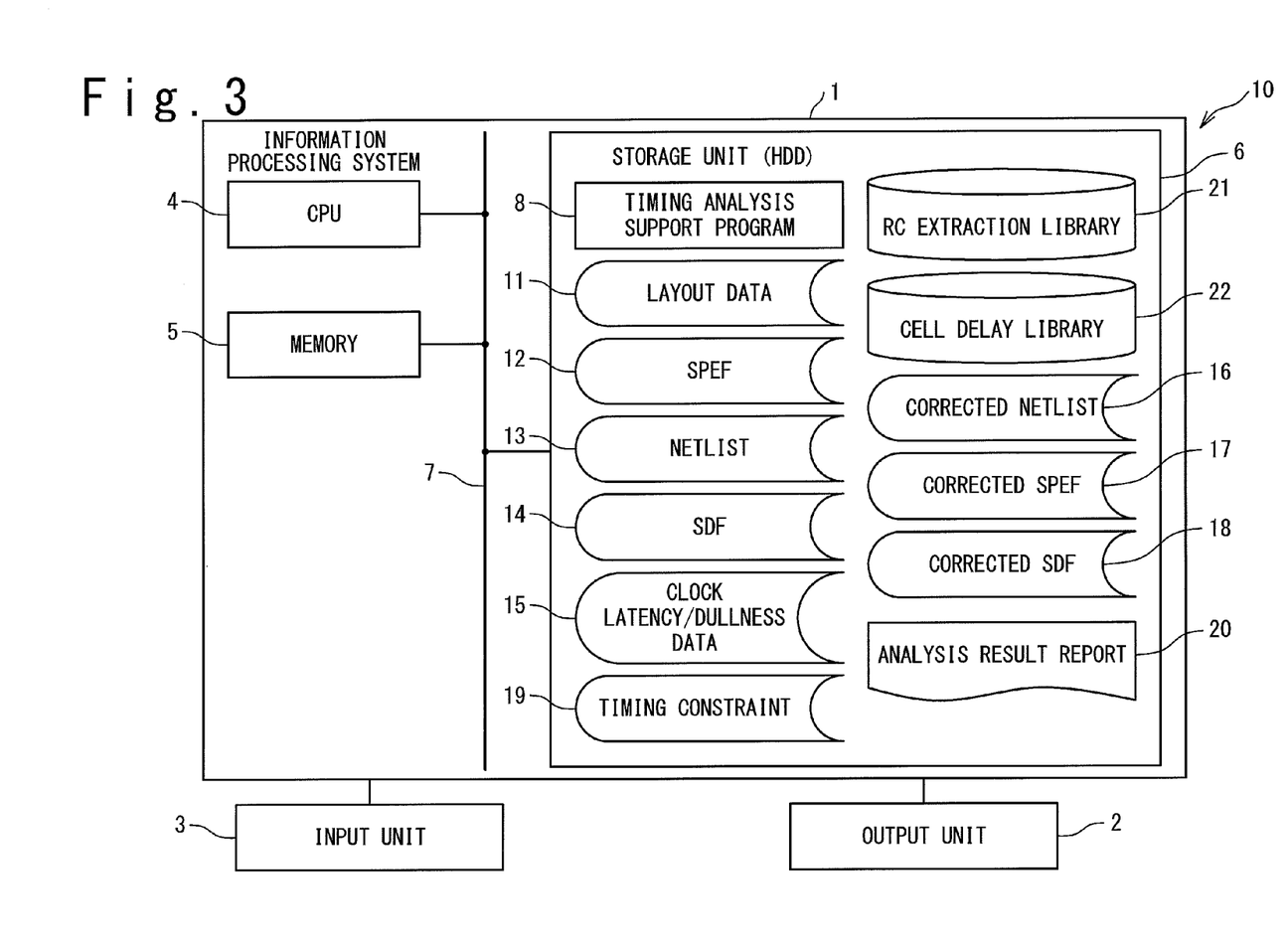
FIG. 3 is a block diagram exemplifying a configuration of a timing analyzing system 10 of the present exemplary embodiment.

FIG. 3 is a block diagram exemplifying a configuration of a timing analyzing system 10 of the present exemplary embodiment. The timing analyzing system 10 includes an information processing system 1, an input unit 2, and an output unit 3. The information processing system 1 is a computer that performs information processing at high speed according to a procedure described in a program. The information processing system 1 achieves five basic functions of input, storage, calculation, control, and output. The input unit 2 is a man-machine interface that inputs data into the information processing system 1. The input unit 2 is exemplified by a keyboard, a mouse, a pen tablet, and a touch panel. The output unit 3 is a man-machine interface that outputs a processing result of the information processing system 1. The output unit 3 is exemplified by a display, and a printer.

The information processing system 1 is a computer that operates on the basis of a program, and includes a CPU 4, a memory 5, and a large capacity storage unit 6, which are connected through a bus 7. The CPU 4 is also referred to as a central processing unit, and performs control of various units provided in the information processing system 1, and processing of data. The CPU 4 interprets and calculates data supplied through the input unit 2, and outputs a result of the calculation to the output unit 3.

The memory 5 is a semiconductor memory device exemplified by a DRAM, and a SRAM. Data is written in the memory 5 in response to an instruction of the CPU 4, and data is read from the memory 5 in response to an instruction of the CPU 4. It should be noted that the memory 5 in the present exemplary embodiment is not limited to the RAM. For example, it may be an EEPROM, or flash memory.

The large capacity storage unit 6 is a storage unit exemplified by an HDD, which permanently stores information. The large capacity storage unit 6 includes a function of continuing to keep information even in case where an externally supplied power supply is interrupted. It should be noted that the large capacity storage unit 6 in the present exemplary embodiment is not limited to the HDD. For example, it may be an EEPROM or a flash memory.

The large capacity storage unit 6 includes a timing analysis support program 8, layout data 11, a SPEF (Standard Parasitic Exchange Format) file 12, a netlist 13, an SDF (Standard Delay Format) file 14, clock latency/rounding information 15, a corrected netlist 16, a corrected SPEF file 17, a corrected SDF file 18, timing constraint 19, an analysis result report 20, an RC extraction library 21, and a cell delay library 22.

The timing analysis support program 8 describes a procedure of a timing analysis of a semiconductor integrated circuit to be designed. In the present exemplary embodiment, the CPU 4 performs calculation and data processing in the procedure described in the timing analysis support program 8. On the basis of this, the information processing system 1 functions as the timing analyzing system 10. Specifically, the information processing system 1 functions as an RC extracting tool 23, a delay calculating tool 24, a clock mesh correcting tool 25, and a timing analyzing tool 29 according to the procedure described in the timing analysis support program 8 read from the large capacity storage unit 6.

The layout data 11, the netlist 13, the timing constraint 19, the RC extraction library 21, the cell delay library 22 are input data to the timing analyzing system 10. The layout data 11 stores layout data after arrangement and wired connection. The netlist 13 stores data representing a logical connection relationship corresponding to the layout data 11. The timing constraint 19 stores timing exception specifications such as a definition of a clock period of an examination circuit, a definition of a fixed SKEW exemplified by a jitter, and a multi-cycle path (path allowing a multiple-cycle delay). The RC extraction library 21 stores a shape of a leaf cell, intra-cell metal graphic data, and capacitance/resistance characteristics of each wiring layer in a target semiconductor process. The cell delay library 22 stores data on a delay between input and output terminals, and a setup time and a hold time in case of a sequential element.

Also, the SPEF (Standard Parasitic Exchange Format) 12, the SDF 14, the clock latency/dullness data 15, a corrected netlist 16, a corrected SPEF17, and a corrected SDF are intermediate data for the timing analyzing system 10. The SPEF 12 stores a resistance and a capacitance (coupling capacitance) of a wiring line from which parasitic data is extracted. The SDF 14 stores a cell delay due to a transistor operation within a cell, and a wiring delay. The clock latency/dullness data 15 stores the worst delay value from a PLL to an input to a driver (receiver circuit L1) serving as a mesh receiver, and waveform rounding at the input to the receiver circuit L1, and has a format having content in which a general STA system can annotate a design. The corrected netlist 16 stores content in which the netlist 13 is edited. The corrected SPEF 17 stores content in which the SPEF 12 is edited. The corrected SDF 18 stores content in which the SDF 14 is edited. The analysis result report 20 is a final output result, and stores data on a path in which a setup/hold delay violation is found in a timing analysis.

Figure 4:
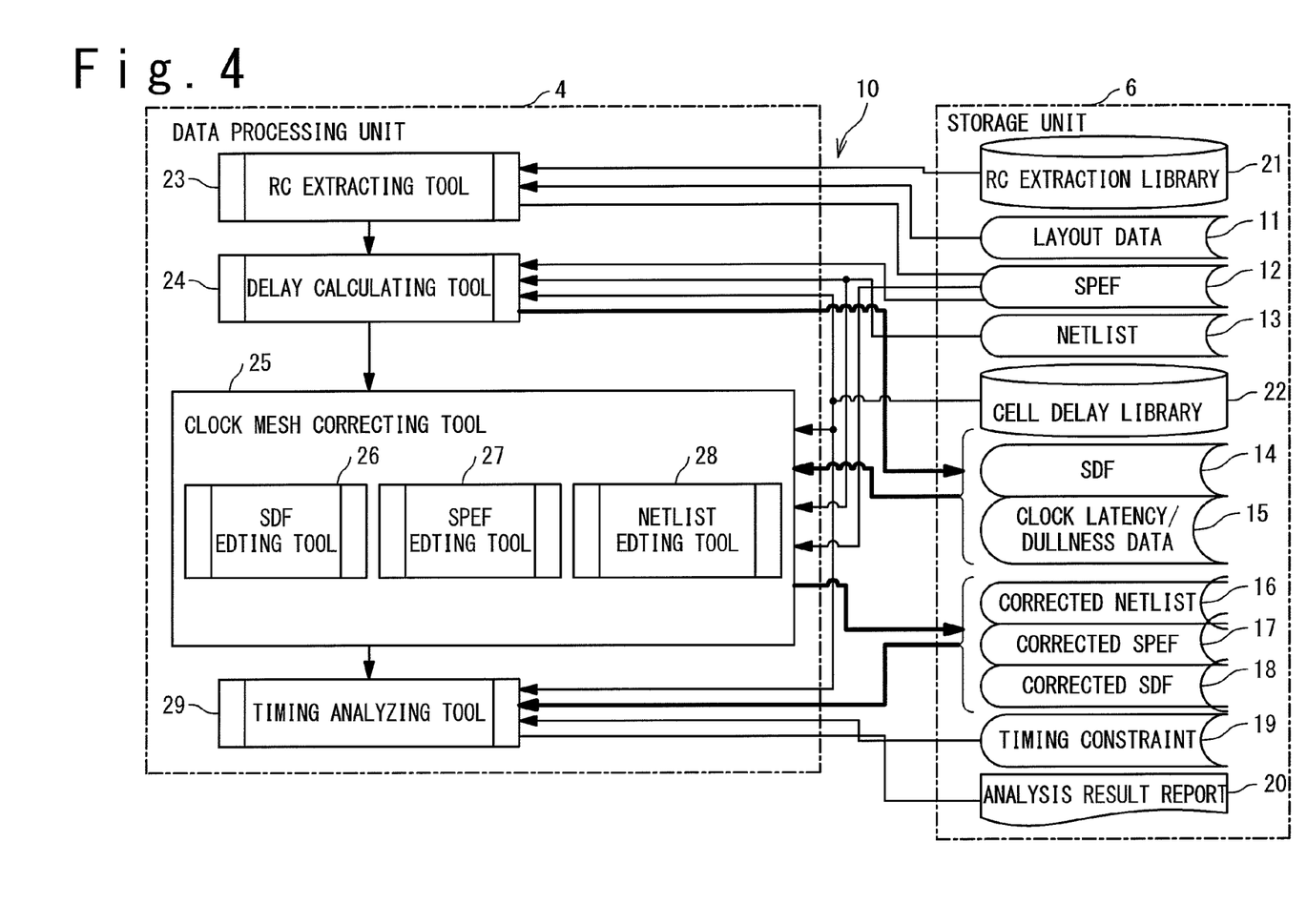
FIG. 4 is a block diagram exemplifying a relationship between functional blocks constituting the timing analyzing system 10 and pieces of data.

FIG. 4 is a functional block diagram showing a relationship between the functional blocks of the timing analyzing system 10 and data. The timing analyzing system 10 includes the RC extracting tool 23, the delay calculating tool 24, the clock mesh correcting tool 25, and the timing analyzing tool 29. Also, the clock mesh correcting tool 25 includes an SDF editing tool 26, an SPEF editing tool 27, and a netlist editing tool 28.

The RC extracting tool 23 inputs the RC extraction library 21 and the layout data 11, and extracts parasitic data to output RC data on a wiring line to the SPEF (Standard Parasitic Exchange Format) 12. The delay calculating tool 24 inputs the cell delay library 22, the netlist 13, and the SPEF 12, and calculates a delay time due to a wiring medium, an intra-cell delay time, and an intra-cell setup/hold time to output them to the SDF 14. At this time, the delay calculating tool 24 outputs a worst delay value from the PLL to the L1 input, and the waveform dullness at the L1 input pin as the clock latency/dullness data 15 in a format used in the clock mesh correcting tool 25 provided in the subsequent stage.

The clock mesh correcting tool 25 includes an STA tool having functions of reading data such as the netlist 13, tracing connections, performing ECO (connection logic change), and outputting the corrected SPEF 17 and the corrected SDF 18. In addition, the clock mesh correcting tool 25 includes the SDF editing tool 26, the SPEF editing tool 27, and the netlist editing tool 28. Detailed operations of these functional blocks will be described later.

The timing analyzing tool 29 performs the timing analysis taking into account a delay variation due to a manufacturing variation, and outputs a result of the performance as the analysis result report 20 indicating the setup/hold violation, and SKEW.

Figure 5:
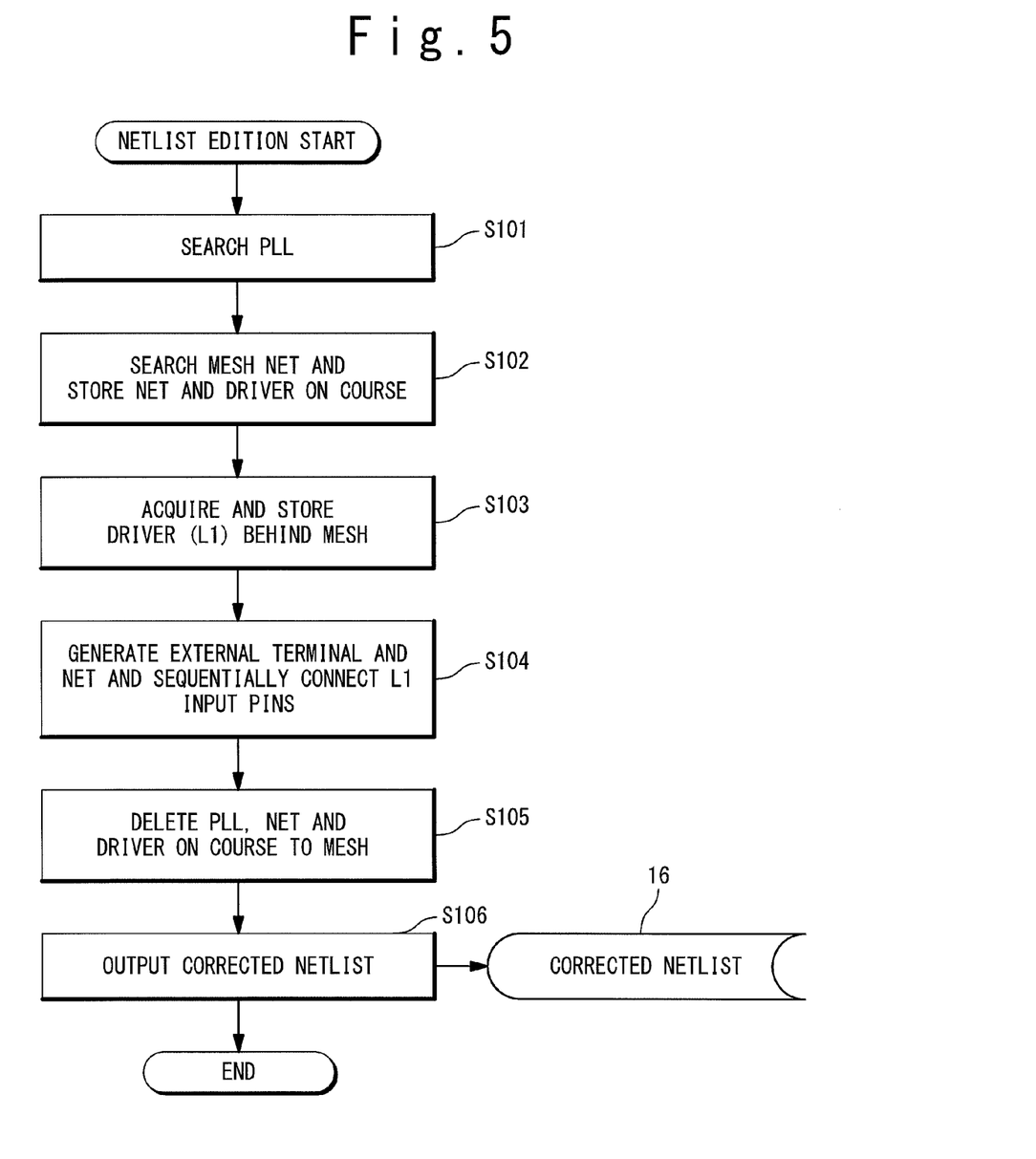
FIG. 5 is a flowchart exemplifying operations of a netlist edit tool 28.

An operation of the present exemplary embodiment will be described below with reference to the drawings. In the following, the operation of the clock mesh correcting tool 25 in the timing analyzing system 10 of the present exemplary embodiment will be described in detail. FIG. 5 is a flowchart showing the operation of the netlist editing tool 28. At Step S101, the netlist editing tool 28 searches a PLL instance, and stores a clock output pin and a net connected to the pin.

AT Step S102, the netlist editing tool 28 searches a net (clock mesh net) of a clock mesh while searching a clock tree from the PLL output pin with a priority to a width. The clock mesh net has a multi-driver configuration. For this reason, the determination can be made on the basis of whether or not the number of drivers of the searched net is two or more. Also, at Step S102, nets on the way to reaching the clock mesh net and driver instances are all stored for the subsequent operation.

AT Step S103, a list of drivers connected as receivers (hereinafter to be referred to as a receiver circuit L1) to the clock mesh net obtained by the operation at Step S102 is obtained and stored.

At Step S104, pseudo external terminals and nets are configured, and input pins in the list of the receiver circuits L1 obtained through the operation at Step S103 are sequentially connected. AT Step S105, the nets and instances stored at the Step S102 are deleted. Subsequently, at Step S106, the edited netlist is outputted as the corrected netlist 16.

Figure 6:
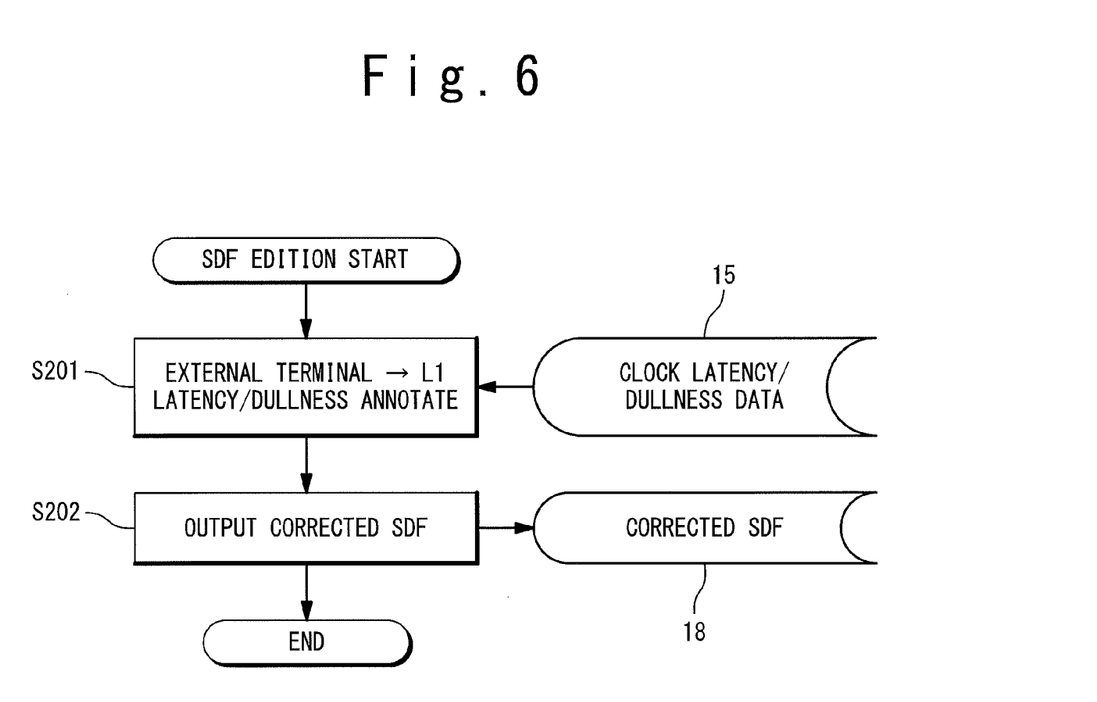
FIG. 6 is a flowchart exemplifying operations of an SDF edit tool 26.

FIG. 6 is a flowchart showing an operation of the SDF editing tool 26. At Step S201, the SDF editing tool 26 reads and refers to the clock latency/dullness data 15 and gives the data contained in the clock latency/dullness data 15 to the corrected net list 16. In this case, the clock latency/dullness data 15 describes the plurality of receiver circuits L1 from the PLL to end points. For this reason, the PLL is inputted by replacing with pseudo external terminals connected to the plurality of receiver circuits L1 in the corrected netlist 16. Then, the SDF editing tool 26 outputs the corrected SDF 18 at Step S202.

Figure 7:
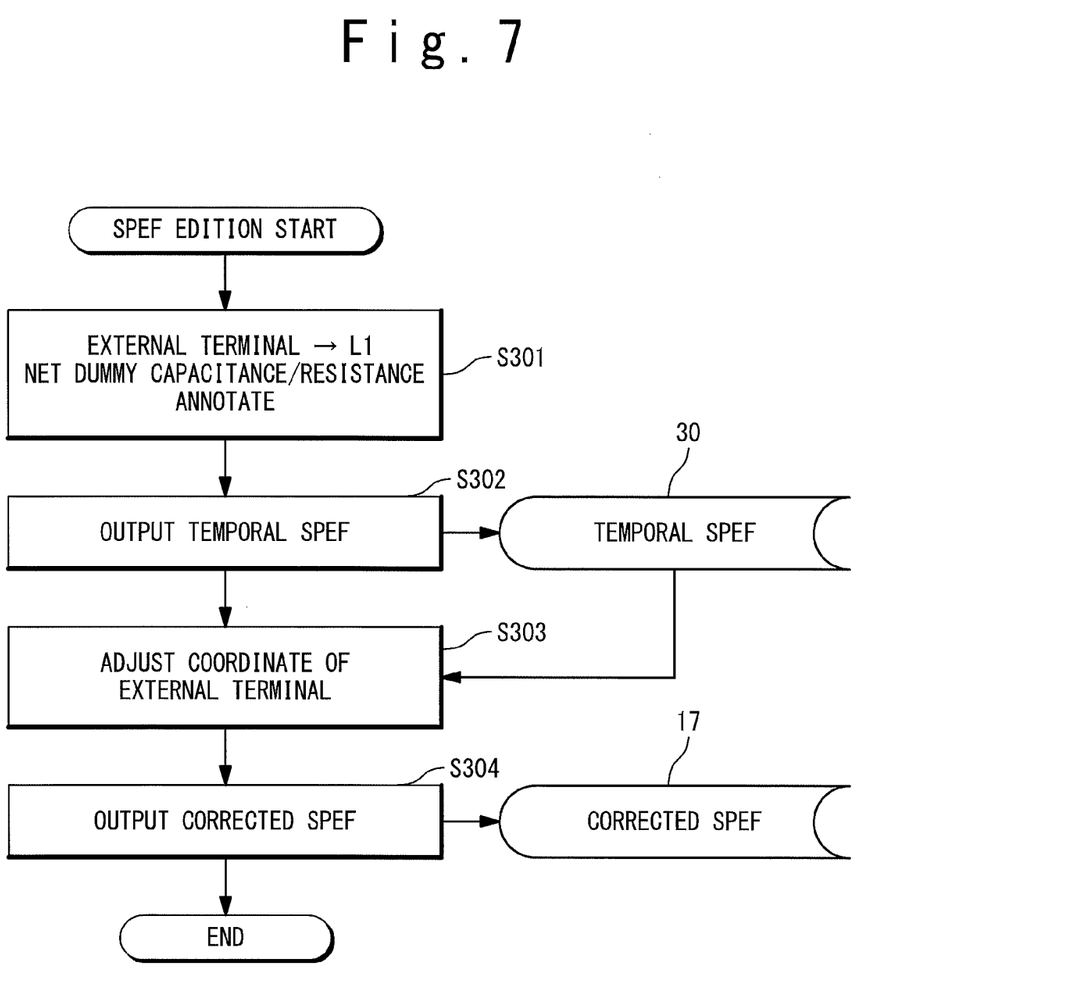
FIG. 7 is a flowchart exemplifying operations of an SPEF edit tool 27.

FIG. 7 is a flowchart showing an operation of the SPEF editing tool 27. At Step S301, the SPEF editing tool 27 gives small dummy capacitance and resistance to each of the nets from the pseudo external terminals to the plurality of receiver circuits L1 on the basis of the corrected netlist 16. At this time, the timing analyzing tool 29 in a subsequent stage inputs the corrected SDF 18 in which delay calculation has been completed, and values contained in it are used. For this reason, the values of resistance and the capacitance inside the SPEF 12 are not used for the delay calculation.

AT Step S302, the SPEF 12 is once outputted as a temporary SPEF 30. At Step S303, upon calculation of the SKEW due to the manufacturing variation by the timing analyzing tool 29, pseudo terminal coordinates for pairs of the pseudo external terminal and the pin of the plurality of receiver circuits L1 in the temporary SPEF 30 are converted or conformed to input terminal coordinates of the receiver circuits L1 in order to take into account only arrangement extension in a stage subsequent to the receiver circuits L1.

At Step S304, the edition content is outputted as the corrected SPEF 17. It should be noted that the process at Step S303 or S304 is not performed with the STA tool, but may be performed with a stream editor. Subsequently, the timing analyzing tool 29 reads the cell delay library 22, the corrected netlist 16, the corrected SPEF 17, the corrected SDF 18, the timing constraint 19 to perform the timing analysis by taking into account the delay variation due to the manufacturing variation, and outputs the setup/hold delay violation, SKEW as the analysis result report 20.

Figure 8:
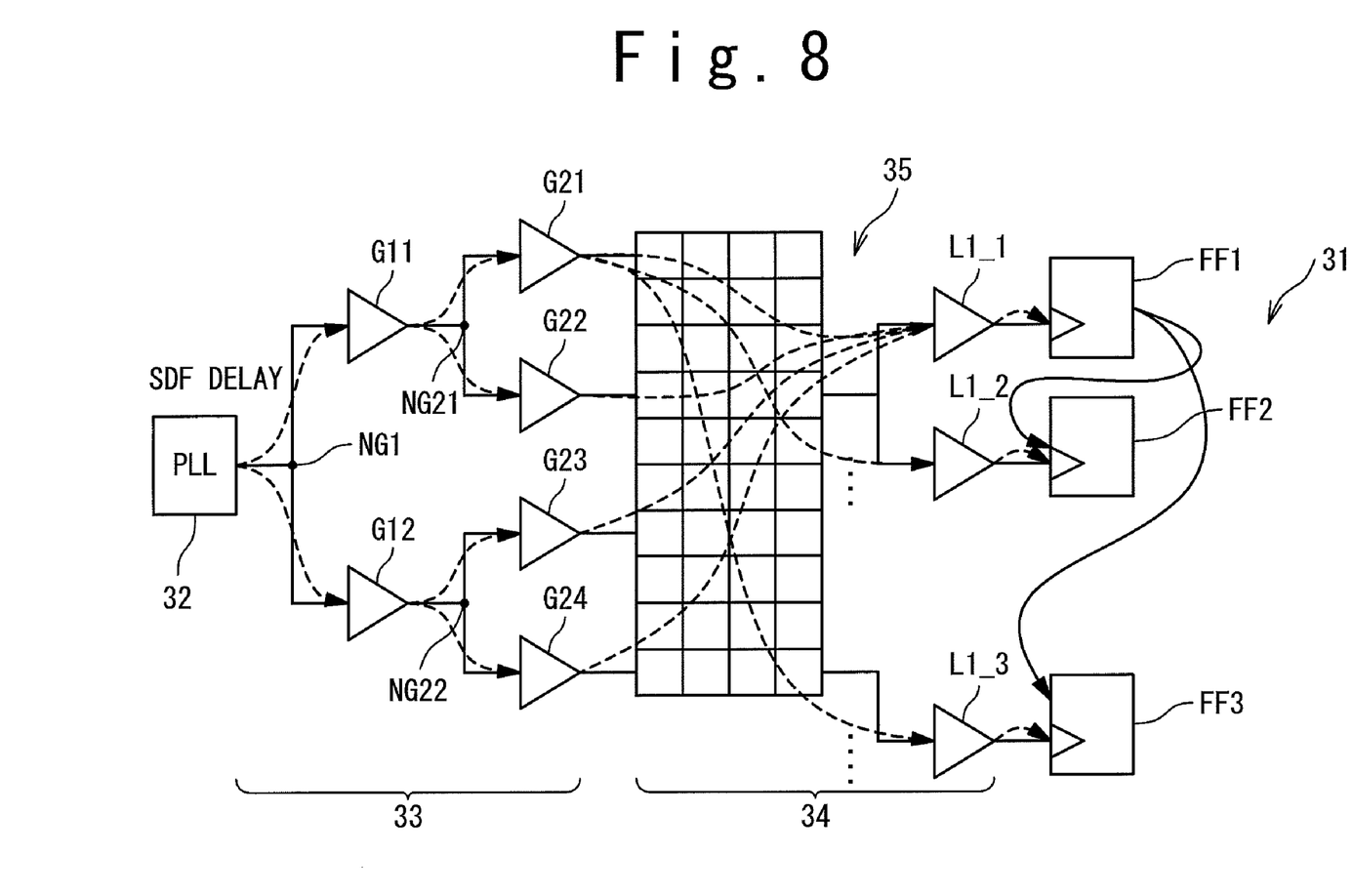
FIG. 8 is a circuit diagram exemplifying a configuration of an analysis target circuit 31 subjected to a timing analysis.

Here, the above-described operation of the timing analyzing system 10 of the present exemplary embodiment will be specifically described. FIG. 8 is a circuit diagram showing a configuration of an analysis target circuit 31 subjected to the timing analysis. The analysis target circuit 31 includes a PLL (Phase Locked Loop) 32, a clock tree area 33, a clock mesh area 34, and a plurality of flip-flops (first flip-flop FF1 to third flip-flop FF3).

Figure 9:
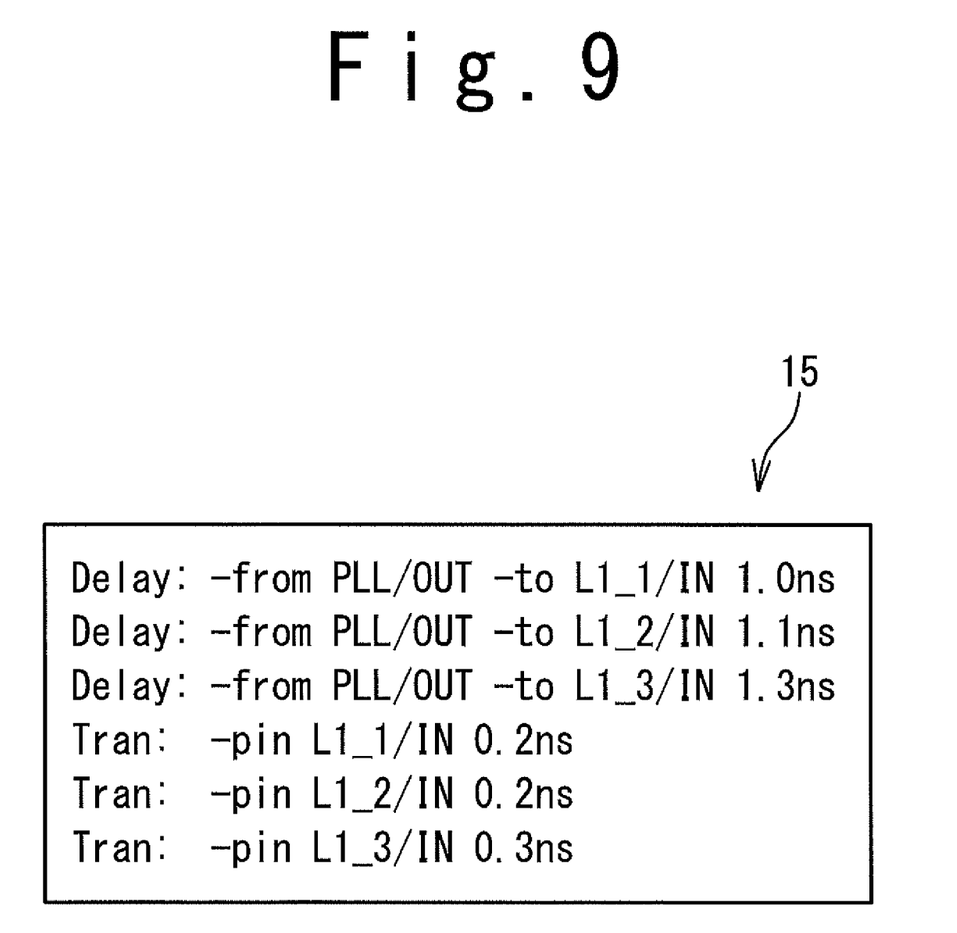
FIG. 9 is a list exemplifying a format of a clock latency/rounding information 15 outputted by a delay calculation tool 24.

The clock tree area 33 includes a first instance G11, a second instance G12, a third instance G21, a fourth instance G22, a fifth instance G23, and a sixth instance G24. The clock mesh area 34 includes a clock mesh net 35 and a plurality of receiver circuits L1 (first receiver circuit L1_1, second receiver circuit L1_2, and third receiver circuit L1_3). It is supposed that a netlist and layout data on a connection relation of the above-described analysis target circuit 31 are given to the timing analyzing system 10 such that processes are sequentially performed with the RC extracting tool 23, and the delay calculating tool 24. FIG. 9 is a list showing a format of the clock latency/dullness data 15 outputted from the delay calculating tool 24. Referring to FIG. 9, a "Delay" row in the clock latency/dullness data 15 indicates a latency delay value from a pin of "-from" to a pin of "-to". A "Tran" row indicates waveform dullness at a pin of "-pin". It should be noted that this description does not limit a configuration of the clock latency/dullness data 15 in the present exemplary embodiment.

As shown in the above-described flowchart of FIG. 5, the netlist editing tool 28 reads the cell delay library 22, the netlist 13, the SDF 14, the SPEF 12, and performs the process of Step S101. When a PLL is searched, the PLL 32 is outputted as a result of the search from the connection diagram shown as the analysis target circuit 31.

At the Step S102, when the clock mesh area 34 is searched while the clock tree area 33 is searched with priority in the width, the clock mesh net 35 is obtained as a result of the search. Also, the stored data on the way is a first net NG1, a second net NG21, a third net NG22, and a clock mesh net 35 in case of the nets, and the first instance G11, the second instance G12, the third instance G21, the fourth instance G22, the fifth instance G23, and the sixth instance G24 in case of instances.

Then, the netlist editing tool 28 performs the above-described process of Step S104. The netlist editing tool 28 obtains the first receiver circuit L1_1, the second receiver circuit L1_2, and the third receiver circuit L1_3 as a list of drivers that are receivers arranged in a stage subsequent to the clock mesh net 35. For the first receiver circuit L1_1, the second receiver circuit L1_2, and the third receiver circuit L1_3, the pseudo external terminals, i.e., a first pseudo terminal E1, a second pseudo terminal E2, and a third pseudo terminal E3, and nets (first pseudo net NE1, second pseudo net NE2, and third pseudo net NE3) are newly generated, respectively, and sequentially connected to the driver input terminals.

Figure 10:
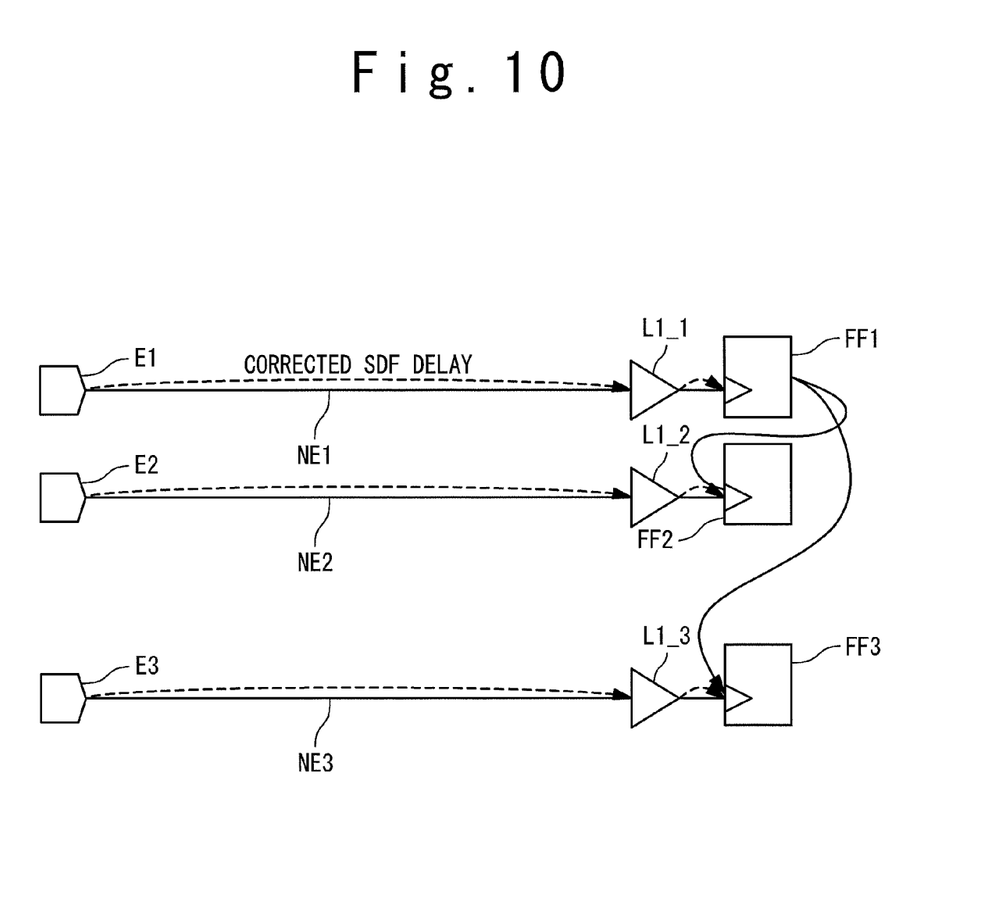
FIG. 10 is a circuit diagram exemplifying a connection image of a corrected netlist 16.

Subsequently, the netlist editing tool 28 deletes the PLL 32, the stored nets (the first net NG1, the second net NG21, the third net NG22, and the clock mesh net 35), and instances (the first instance G11, the second instance G12, the third instance G21, the fourth instance G22, the fifth instance G23, and the sixth instance G24). Then, the edited netlist 13 is outputted as the corrected netlist 16. FIG. 10 is a circuit diagram showing a connection diagram of the corrected netlist 16.

Figure 11:
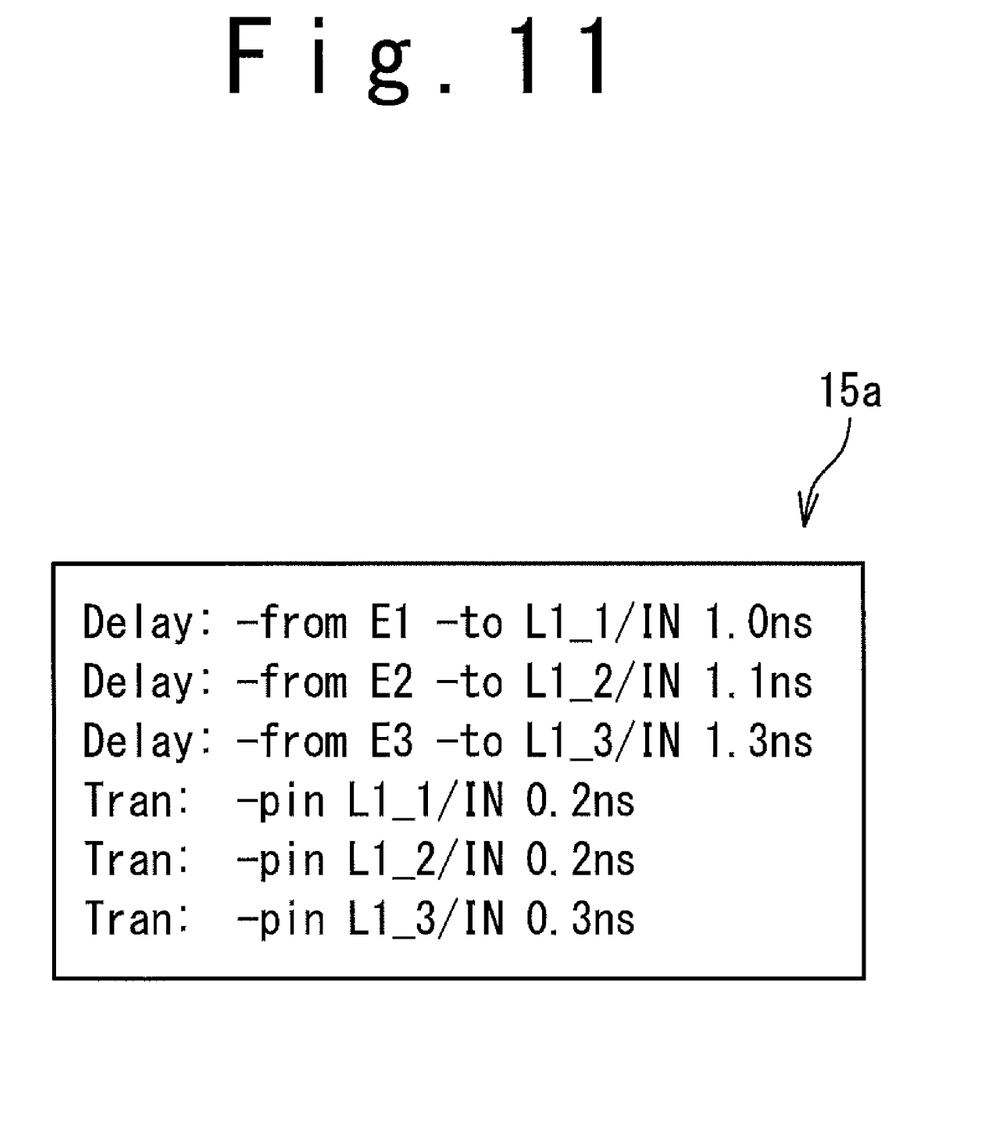
FIG. 11 is a list exemplifying a replaced file (clock latency/rounding information 15a)

Subsequently, processing advances to the SDF editing tool 26. The SDF editing tool 26 reads the clock latency/dullness data 15 in order to perform the above-described process of Step S201. At this time, the SDF editing tool 26 directly reads the "Tran" rows in the clock latency/dullness data 15. Regarding the "Delay" row, tracing from a pin of "-to" to a fan-in side with the tool allows a pseudo external terminal to be uniquely defined. Accordingly, a "-from" specification is inputted to the SDF editing tool 26 with being replaced with the pseudo external terminal. FIG. 11 is a list showing a replaced file (clock latency/dullness data 15a). Then, the SDF editing tool 26 outputs the corrected SDF 18. In the above FIG. 10, timing arc images in the corrected SDF 18 are shown.

Figure 12:
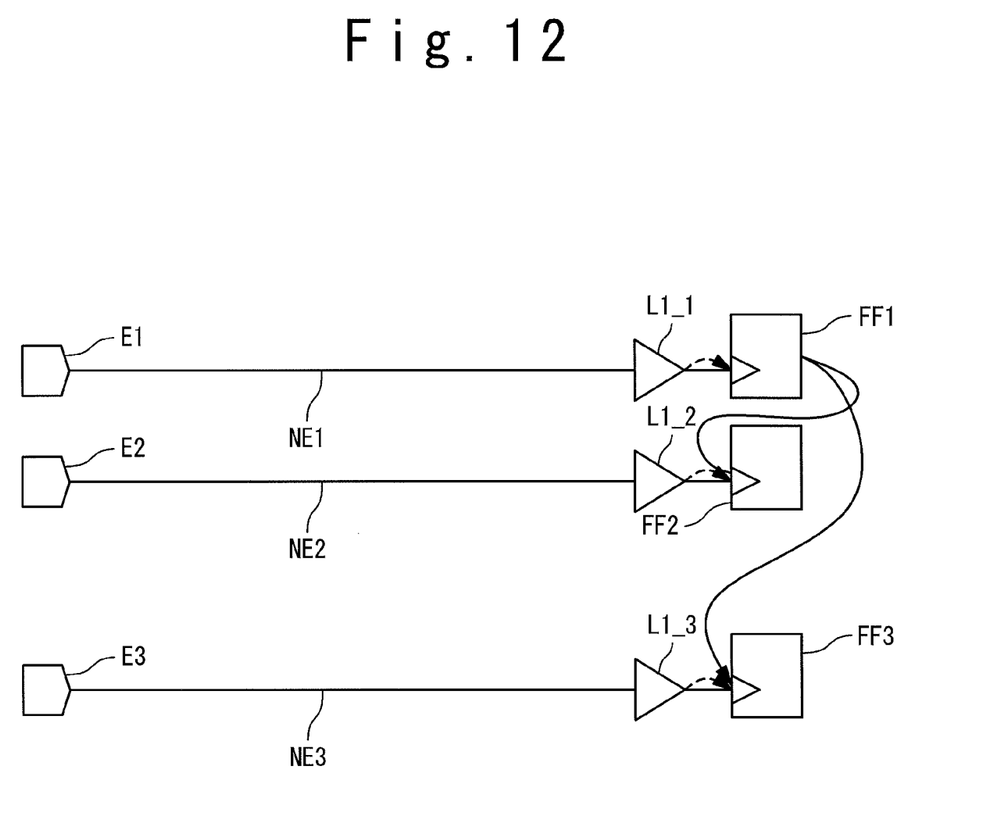
FIG. 12 is a circuit diagram exemplifying an image of a temporary SPEF 30.

Subsequently, the control flow advances to the SPEF editing tool 27. The SPEF editing tool 27 gives small dummy capacitance and resistance values to each of the nets from the pseudo external terminals to the plurality of receiver circuits L1 (first receiver circuit L1_1, second receiver circuit L1_2, and third receiver circuit L1_3) in the corrected netlist 16. At this time, the SPEF editing tool 27 once outputs the SPEF 12 as the temporary SPEF 30. FIG. 12 is a circuit diagram showing the temporary SPEF 30.

Figure 13:
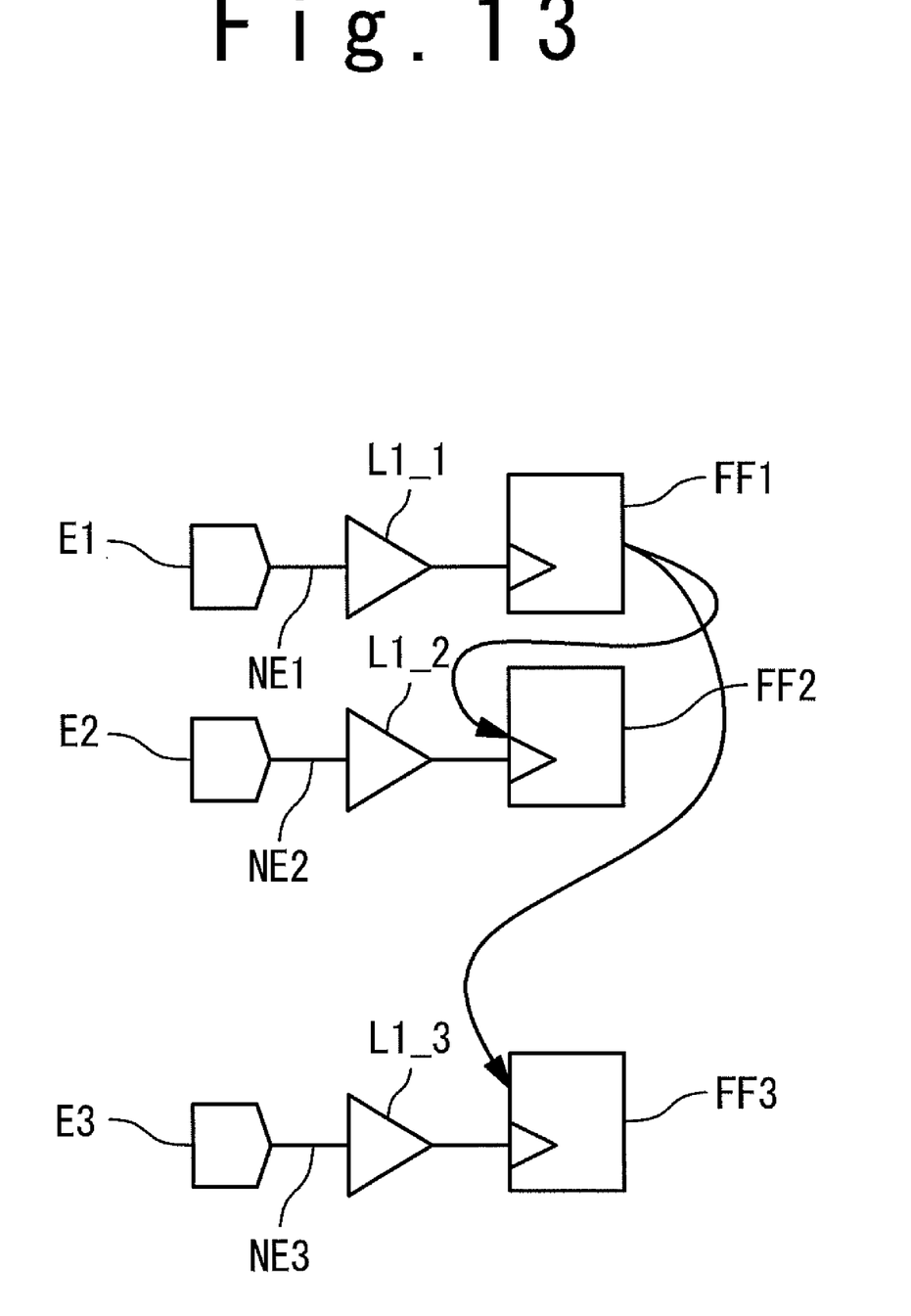
FIG. 13 is a circuit diagram exemplifying an image of a corrected SPEF 17.

The SPEF editing tool 27 sets the pseudo terminal coordinates of pairs of the pseudo external terminals and the plurality of receiver circuits L1 in the temporary SPEF 30 to the input terminal coordinates of the receiver circuits L1. Then, the edition content is outputted as the corrected SPEF 17. FIG. 13 is a circuit diagram exemplifying an image of the corrected SPEF 17.

The timing analyzing tool 29 reads the cell delay library 22, the corrected netlist 16, the corrected SPEF 17, the corrected SDF 18, and the timing constraint 19 to perform the timing analysis by taking into account the delay variation due to the manufacturing variation, and outputs the setup/hold delay violation, and SKEW as the analysis result report 20.

As described above, the timing analyzing system 10 of the present exemplary embodiment can highly accurately perform the timing analysis of a clock path having a clock mesh structure by the existing STA system by simplifying a netlist from a PLL to a mesh, and setting a delay variation from the PLL to drivers (L1) serving as receivers of the mesh to a calculation model which depend on the positions of the respective drivers L1.

CRPR branch points are set to receiver circuits L1 or pseudo external terminals by the corrected netlist, and an arrangement extension is set to an arrangement extension according to a distance between the receiver circuit L1 and the flip-flop, and the timing analyzing system 10 of the present exemplary embodiment can calculate a variation delay in consideration of them. For this reason, even if a mesh is arranged on an entire surface of a chip, the timing analysis can be performed without depending on the large arrangement extension.

As above, the exemplary embodiment of the present invention has been specifically described. The present invention is not limited to the above-described exemplary embodiment, but can be variously modified without departing from the scope thereof. Also, the exemplary embodiment of the present invention can be combined in a range without any contradiction.

What is claimed is:

1. A timing analyzing system comprising:
an RC extracting section configured to generate an SPEF (Standard Parasitic Exchange Format) file which contains resistance and capacitance components of wirings;
a delay calculating section configured to generate an SDF (Standard Delay Format) file based on said SPEF file;
a clock mesh calculating section configured to generate a corrected circuit model by simplifying a netlist on a clock path to pass through a clock mesh structure from an input stage; and
a timing analysis section configured to perform timing analysis of a semiconductor integrated circuit of an analysis target based on said corrected circuit model,
wherein said clock mesh calculating section comprises:
a netlist editing tool;

an SDF file editing tool; and
an SPEF file editing tool,
wherein said netlist editing tool specifies a clock mesh net formed of said clock mesh structure in a subsequent stage of an output pin of an instance of an input stage, and an input pin of a driver connected with said clock mesh net as a receiver, and generates a corrected netlist by connecting a pseudo external terminal to said input pin through a new net,
wherein said SDF file editing tool reads a clock latency/dullness data indicating that the worst delay value from said instance to said driver and dullness of an input waveform of said driver, and generates a corrected SDF file by giving data contained in said clock latency/dullness data to said corrected netlist,
wherein said SPEF file editing tool generates a corrected SPEF file by giving a dummy capacitance and a dummy resistance to a net from a pseudo external terminal to said driver based on said corrected netlist, and
wherein said timing analyzing section performs timing analysis of said semiconductor integrated circuit based on said corrected netlist, said corrected SDF file and said corrected SPEF file.

2. The timing analyzing system according to claim 1, wherein said timing analyzing section reads a cell delay library and a timing constraint, and generates an analysis result report which contains data of a path which violates a setup/hold delay based on said corrected netlist, said corrected SDF file, said corrected SPEF file, said cell delay library and said timing constraint.

3. The timing analyzing system according to claim 1, wherein said RC extracting section extracts parasitic data of said semiconductor integrated circuit based on an RC extraction library and a layout data of said semiconductor integrated circuit to output said SPEF file which contains RC data of the wiring.

4. The timing analyzing system according to claim 1, wherein said delay calculating section calculates a delay time due to wiring media, an intra-cell delay time, and an intra-cell setup/hold time to generate said SDF file.

5. The timing analyzing system according to claim 1, wherein said netlist editing tool stores said net on a course from said input stage to said clock mesh net and said driver, and after connecting said pseudo external terminal with said input pin through said new net, deletes said net and said driver, and generates said corrected netlist.

6. The timing analyzing system according to claim 1, wherein said SDF file editing tool generates said corrected SDF file by replacing said input stage with said pseudo external terminal connected with the driver inside said corrected netlist based on said clock latency/dullness data.

7. The timing analyzing system according to claim 1, wherein said SPEF file editing tool generates a temporary SPEF file based on said corrected netlist and said SPEF file, and generates said corrected SPEF file by setting pseudo terminal coordinate of a pair of said pseudo external terminal and the pin of said driver in said temporary SPEF file to a same coordinate as input terminal coordinates of said drivers.

8. A non-transitory computer-readable recording medium in which a computer-executable program code is stored to cause a computer to attain a method of performing timing analysis of a semiconductor integrated circuit, wherein said method comprises:
generating an SPEF (Standard Parasitic Exchange Format) file which contains resistance and capacitance components of wirings;
generating an SDF (Standard Delay Format) file based on said SPEF file;
generating a corrected circuit model by simplifying a netlist on a clock path to pass through a clock mesh structure from an input stage; and
performing timing analysis of a semiconductor integrated circuit of an analysis target based on said corrected circuit model,
wherein said generating a corrected circuit model comprises:
editing said netlist;
editing said SDF file; and
editing said SPEF file,
wherein said editing said netlist comprises:
specifying a clock mesh net of said clock mesh structure formed in a subsequent stage to an output pin of said input stage, and an input pin of a driver connected with said clock mesh net as a receiver; and
generating a corrected netlist by connecting a pseudo external terminal to said input pin through a new net,
wherein said editing said SDF file comprises:
reading a clock latency/dullness data indicating the worst delay value from said input stage to said driver and dullness of an input waveform of said driver; and
generating a corrected SDF file by giving data contained in said clock latency/dullness data to said corrected netlist,
wherein said editing said SPEF file comprises:
generating a corrected SPEF file by giving a dummy capacitance and a dummy resistance to a net from a pseudo external terminal to said driver based on said corrected netlist, and
wherein said performing timing analysis comprises:
performing the timing analysis of said semiconductor integrated circuit based on said corrected netlist, said corrected SDF file and said corrected SPEF file.

9. The non-transitory computer-readable recording medium according to claim 8, wherein said performing timing analyzing comprises:
reading a cell delay library and a timing constraint; and
generating an analysis result report which contains data of a path which violates a setup/hold delay based on said corrected netlist, said corrected SDF file, said corrected SPEF file, said cell delay library and said timing constraint.

10. The non-transitory computer-readable recording medium according to claim 8, wherein said generating an SPEF file comprises:
extracting parasitic data of said semiconductor integrated circuit based on an RC extraction library and a layout data of said semiconductor integrated circuit to output said SPEF file which contains RC data of the wiring.

11. The non-transitory computer-readable recording medium according to claim 8, wherein said generating an SDF file comprises:
generating said SDF file by calculating a delay time due to wiring media, an intra-cell delay time, and an intra-cell setup/hold time.

12. The non-transitory computer-readable recording medium according to claim 8, wherein said editing said netlist comprises:
storing said net on a course from said input stage to said clock mesh net and said driver; and
after connecting said pseudo external terminal with said input pin through said new net, deleting said net and said driver on the course, to generate said corrected netlist.

13. The non-transitory computer-readable recording medium according to claim 8, wherein said editing said SDF file comprises:
- generating said corrected SDF file by replacing said input stage with said pseudo external terminal connected with the driver in said corrected netlist based on said clock latency/dullness data.

14. The non-transitory computer-readable recording medium according to claim 8, wherein said editing said SPEF file comprises:
- generating a temporary SPEF file based on said corrected netlist and said SPEF file; and
- generating said corrected SPEF file by setting pseudo terminal coordinate of a pair of said pseudo external terminals and the pin of said driver in said temporary SPEF file to a same coordinate as an input terminal coordinate of said drivers.

15. A method of performing timing analysis of a semiconductor integrated circuit, comprising:
- generating, by a computer, an SPEF (Standard Parasitic Exchange Format) file which contains resistance and capacitance components of wirings;
- generating, by the computer, an SDF (Standard Delay Format) file based on said SPEF file;
- generating, by the computer, a corrected circuit model by simplifying a netlist on a clock path to pass through a clock mesh structure from an input stage; and
- performing, by the computer, timing analysis of a semiconductor integrated circuit of an analysis target based on said corrected circuit model, wherein said generating a corrected circuit model comprises:
- editing said netlist;
- editing said SDF file; and
- editing said SPEF file, wherein said editing said netlist comprises:
- specifying a clock mesh net of said clock mesh structure formed in a subsequent stage to an output pin of said input stage, and an input pin of a driver connected with said clock mesh net as a receiver; and
- generating a corrected netlist by connecting a pseudo external terminal to said input pin through a new net, wherein said editing said SDF file comprises:
- reading a clock latency/dullness data indicating the worst delay value from said input stage to said driver and dullness of an input waveform of said driver; and
- generating a corrected SDF file by giving data contained in said clock latency/dullness data to said corrected netlist, wherein said editing said SPEF file comprises:
- generating a corrected SPEF file by giving a dummy capacitance and a dummy resistance to a net from a pseudo external terminal to said driver based on said corrected netlist, and wherein said performing timing analysis comprises:
- performing the timing analysis of said semiconductor integrated circuit based on said corrected netlist, said corrected SDF file and said corrected SPEF file.

\* \* \* \* \*